United States Patent
Tsuru (10) Patent No.: US 11,211,919 B2
(45) Date of Patent: Dec. 28, 2021

(54) POLYPHASE FILTER

(71) Applicant: Mitsubishi Electric Corporation, Tokyo (JP)

(72) Inventor: Masaomi Tsuru, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/023,075

(22) Filed: Sep. 16, 2020

(65) Prior Publication Data
US 2020/0412339 A1  Dec. 31, 2020

Related U.S. Application Data

(63) Continuation of application No. PCT/JP2018/016015, filed on Apr. 18, 2018.

(51) Int. Cl.
  *H03H 7/06* (2006.01)
  *H03H 11/04* (2006.01)

(52) U.S. Cl.
  CPC .............. *H03H 11/04* (2013.01); *H03H 7/06* (2013.01)

(58) Field of Classification Search
  CPC .................................. H03H 11/04; H03H 7/06
  See application file for complete search history.

(56) References Cited

U.S. PATENT DOCUMENTS

| 3,618,133 | A | 11/1971 | Gingell |
| 4,123,712 | A | 10/1978 | Mikhael |
| 4,326,109 | A | 4/1982 | McGee et al. |
| 7,164,901 | B2 * | 1/2007 | Zheng ............... H03D 3/008 375/320 |
| 8,412,141 | B2 * | 4/2013 | Savoj ................. H03H 7/21 455/307 |
| 9,281,796 | B2 * | 3/2016 | Reynaert .......... H03H 7/0138 |
| 9,281,888 | B1 * | 3/2016 | Mu .................... H03H 7/21 |

(Continued)

FOREIGN PATENT DOCUMENTS

| JP | 3-267807 A | 11/1991 |
| JP | 2001-313544 A | 11/2001 |

(Continued)

OTHER PUBLICATIONS

Extended European Search Report for European Application No. 18915138.4, dated Nov. 26, 2020.

(Continued)

*Primary Examiner* — Dinh T Le
(74) *Attorney, Agent, or Firm* — Birch, Stewart, Kolasch & Birch, LLP (57) ABSTRACT

A first resistor to a fourth resistor and a first capacitor to a fourth capacitor are connected together in series in a ring shape. A first output terminal to a fourth output terminal are connected to series connection points between the first resistor to the fourth resistor and the first capacitor to the fourth capacitor, a first input terminal is connected to a series connection point between the fourth capacitor and the first resistor, and a second input terminal is connected to a series connection point between the second capacitor and the third resistor. Furthermore, a fifth resistor is connected between a series connection point between the first capacitor and the second resistor and a series connection point between the third capacitor and the fourth resistor.

12 Claims, 3 Drawing Sheets

(56) References Cited

U.S. PATENT DOCUMENTS

| | | | |
|---|---|---|---|
| 10,425,062 B2 * | 9/2019 | Kato | H03H 11/12 |
| 10,763,826 B2 * | 9/2020 | Hirai | H03H 11/20 |
| 2011/0092169 A1 | 4/2011 | Savoj | |

FOREIGN PATENT DOCUMENTS

| | | |
|---|---|---|
| JP | 2002-26614 A | 1/2002 |
| JP | 2013-509096 A | 3/2013 |

OTHER PUBLICATIONS

European Communication pursuant to Article 94(3) EPC for European Application No. 18915138.4, dated Sep. 16, 2021.

\* cited by examiner

POLYPHASE FILTER

CROSS REFERENCE TO RELATED APPLICATION

This application is a Continuation of PCT International Application No. PCT/JP2018/016015, filed on Apr. 18, 2018, which is hereby expressly incorporated by reference into the present application.

TECHNICAL FIELD

The present invention relates to an RC polyphase filter.

BACKGROUND ART

An RC polyphase filter is available as a polyphase filter. In a conventional RC polyphase filter, resistors R and capacitors C are alternately connected together in series in a ring shape and a circuit is formed with four resistors and four capacitors, and first and second input terminals and first to fourth output terminals are included (for example, see Patent Literature 1). In such a polyphase filter, a predetermined frequency is differentially input to the first input terminal and the second input terminal, and a predetermined frequency of a quadrature differential is output from the first to fourth output terminals.

CITATION LIST

Patent Literature

Patent Literature 1: JP 2013-509096 A

SUMMARY OF INVENTION

Technical Problem

However, since the conventional polyphase filter has an asymmetric circuit configuration, voltages and currents output to the first to fourth output terminals are unbalanced, and there has been a problem that variations in impedance occurs, and an amplitude error or a phase error occurs.

The present invention has been made to solve the problem as described above, and an object thereof is to provide a polyphase filter that can obtain an output in which the variations in impedance, the amplitude error, and the phase error are suppressed.

Solution to Problem

In the polyphase filter according to the present invention, a first resistor, a first reactance element, a second resistor, a second reactance element, a third resistor, a third reactance element, a fourth resistor, and a fourth reactance element are connected together in series in a ring shape, and a fifth resistor is connected between a series connection point between the first reactance element and the second resistor and a series connection point between the third reactance element and the fourth resistor, and a first output terminal is connected to a series connection point between the first resistor and the first reactance element, a second output terminal is connected to a series connection point between the second resistor and the second reactance element, a third output terminal is connected to a series connection point between the third resistor and the third reactance element, a fourth output terminal is connected to a series connection point between the fourth resistor and the fourth reactance element, a first input terminal is connected to a series connection point between the fourth reactance element and the first resistor, and a second input terminal is connected to a series connection point between the second reactance element and the third resistor. However, the ring shape here does not indicate only a circle, but is a circuit that forms a path through which a current can flow regardless of the shape.

Advantageous Effects of Invention

In the polyphase filter of the present invention, the four resistors and the four reactance elements are alternately connected together in series to form the circuit in the ring shape, the first to fourth output terminals are connected to the series connection points between the first to fourth resistors and the first to fourth reactance elements, the first input terminal is connected to the series connection point between the fourth reactance element and the first resistor, and the second input terminal is connected to the series connection point between the second reactance element and the third resistor. Furthermore, the fifth resistor is connected between the series connection point between the first reactance element and the second resistor and the series connection point between the third reactance element and the fourth resistor. As a result, the symmetry of the circuit is improved, and it is possible to suppress the variations in impedance, the amplitude error, and the phase error.

DESCRIPTION OF EMBODIMENTS

Hereinafter, to explain the present invention in more detail, embodiments for carrying out the present invention will be described by referring to the accompanying drawings.

First Embodiment

Figure 1:
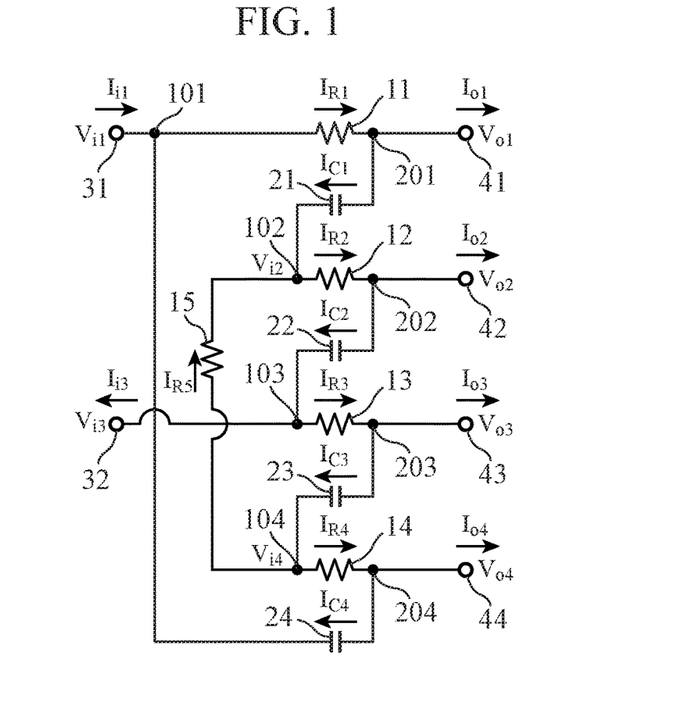
FIG. 1 is a configuration diagram illustrating a polyphase filter according to a first embodiment of the present invention.

FIG. 1 is a configuration diagram illustrating a polyphase filter according to a present embodiment.

In the polyphase filter illustrated in FIG. 1, resistors and capacitors that are reactance elements are alternately connected together in series to form a circuit in a ring shape, and input terminals and output terminals are included at connection points between the resistors and the capacitors. Specifically, a first resistor 11, a second resistor 12, a third resistor 13, a fourth resistor 14, a fifth resistor 15, a first capacitor 21, a second capacitor 22, a third capacitor 23, a fourth capacitor 24, a first input terminal 31, a second input terminal 32, a first output terminal 41, a second output terminal 42, a third output terminal 43, and a fourth output terminal 44 are included. However, the ring shape here does not indicate only a circle, but also includes a shape with corners (an arrangement shape including the first resistor 11, the first capacitor 21, the second resistor 12, the second capacitor 22, the third resistor 13, the third capacitor 23, the fourth resistor 14, and the fourth capacitor 24 in FIG. 1).

The first input terminal 31 is connected to a series connection point 101 between the first resistor 11 and the fourth capacitor 24, and the second input terminal 32 is connected to a series connection point 103 between the third resistor 13 and the second capacitor 22. The first output terminal 41 is connected to a series connection point 201 between the first resistor 11 and the first capacitor 21, the second output terminal 42 is connected to a series connection point 202 between the second resistor 12 and the second capacitor 22, the third output terminal 43 is connected to a series connection point 203 between the third resistor 13 and the third capacitor 23, and the fourth output terminal 44 is connected to a series connection point 204 between the fourth resistor 14 and the fourth capacitor 24. One end of the fifth resistor 15 is connected to a series connection point 102 between the first capacitor 21 and the second resistor 12, and the other end of the fifth resistor 15 is connected to a series connection point 104 between the third capacitor 23 and the fourth resistor 14. An absolute value of an impedance of each of the first resistor 11 to the fourth resistor 14 and the first capacitor 21 to the fourth capacitor 24 is the same as an impedance of the first input terminal 31 at a predetermined frequency.

Next, the operation of the polyphase filter according to the first embodiment will be described.

A radio wave input from the first input terminal 31 is input to the series connection point 101 between the first resistor 11 and the fourth capacitor 24, and a radio wave input from the second input terminal 32, having a differential relationship with the radio wave input from the first input terminal 31, is input to the series connection point 103 between the third resistor 13 and the second capacitor 22. In the figure, Iii represents an input current of the first input terminal 31, $I_{i3}$ represents an input current of the second input terminal 32, $V_{i1}$ represents an input voltage of the first input terminal 31, and $V_{i3}$ represents an input voltage of the second input terminal 32.

The first output terminal 41 is connected to the second output terminal 42 through the first capacitor 21, the second output terminal 42 is connected to the third output terminal 43 through the second capacitor 22, the third output terminal 43 is connected to the fourth output terminal 44 through the third capacitor 23, and the fourth output terminal 44 is connected to the first output terminal 41 through the fourth capacitor 24, so that outputs of the output terminals 41, 42, 43, and 44 differ in phase by 90 degrees each. The resistor between the capacitor and the output terminal does not contribute to the amount of phase shift. Thus, quadrature differential outputs (for example, 0°, −90°, −180°, −270° can be obtained. In the figure, $I_{R1}$ represents a current flowing through the first resistor 11, and $V_{o1}$ and $I_{o1}$ represent an output voltage and an output current of the first output terminal 41. Similarly, $I_{R2}$ represents a current flowing through the second resistor 12, $V_{o2}$ and $I_{o2}$ represent an output voltage and an output current of the second output terminal 42, $I_{R3}$ represents a current flowing through the third resistor 13, and $V_{o3}$ and $I_{o3}$ represent an output voltage and an output current of the third output terminal 43, and $I_{R4}$ represents a current flowing through the fourth resistor 14, and $V_{o4}$ and $I_{o4}$ represent an output voltage and an output current of the fourth output terminal 44. Furthermore, $I_{C1}$ to $I_{C4}$ respectively represent currents flowing through the first capacitor 21 to the fourth capacitor 24, $V_{i2}$ and $V_{i4}$ respectively represent voltages at the series connection point 102 and the series connection point 104, and $I_{R5}$ represents a current flowing through the fifth resistor 15.

Regarding the amplitude, the current $I_{C4}$ flowing through the fourth capacitor 24 merges with the current $I_{i1}$ flowing through the first input terminal 31 and flows through the first resistor 11, and the current $I_{R1}$ flowing through the first resistor 11 is distributed to the first output terminal 41 and the first capacitor 21. The current $I_{C1}$ flowing through the first capacitor 21 merges with the current $I_{R5}$ flowing through the fifth resistor 15 and flows through the second resistor 12, and the current $I_{R2}$ flowing through the second resistor 12 is distributed to the second output terminal 42 and the second capacitor 22. When the fifth resistor 15 is not provided, the current $I_{R2}$ flowing through the second resistor 12 includes only the current $I_{C1}$ ($<I_{R1}$) flowing through the first capacitor 21, and is not a current balanced with the current $I_{R1}$ flowing through the first resistor 11.

Furthermore, the current $I_{C2}$ flowing through the second capacitor 22 is distributed to the current $I_{i3}$ flowing through the second input terminal 32 (in a reverse-phase relationship with the first input terminal 31) and the third resistor 13, and the current $I_{R3}$ flowing through the third resistor 13 is distributed to the third output terminal 43 and the third capacitor 23. The current $I_{C3}$ flowing through the third capacitor 23 is distributed to the fifth resistor 15 and the fourth resistor 14, and the current $I_{R4}$ flowing through the fourth resistor 14 is distributed to the fourth output terminal 44 and the fourth capacitor 24. When the fifth resistor 15 is not provided, the current $I_{R4}$ flowing through the fourth resistor 14 includes only the current $I_{C3}$ ($I_{R3}$) flowing through the third capacitor 23, and is not a current balanced with the current $I_{R3}$ flowing through the third resistor 13.

From these, by providing the fifth resistor 15, a highly symmetrical voltage-current relationship is formed. Since the impedance is the ratio between the voltage and the current, a good balance between the voltage and the current makes the impedances equal to each other, and can eliminate a deviation of the impedance matching. Furthermore, since the voltage and the current are balanced with each other, the amplitude error and the phase error are suppressed. Furthermore, since the amplitude error is a factor of the phase error when the vector composition is considered, suppressing the amplitude error also suppresses the phase error.

Furthermore, resistance values of the first resistor 11 to the fourth resistor 14 are made equal to impedances of the first input terminal 31, the second input terminal 32, and the first output terminal 41 to the fourth output terminal 44, and a resistance value of the fifth resistor 15 is set to be twice the impedance of the first input terminal 31 (equal to a load impedance between the first input terminal 31 and the second input terminal 32 in absolute value), whereby, in principle, impedance matching can be achieved at all input and output terminals, and the amplitude error and the phase error can be made zero. For example, when load impedances of the first input terminal 31 and the second input terminal 32 each are 50Ω, the impedance between the first input terminal 31 and the second input terminal 32 is 100Ω, the resistance values of the first output terminal 41 to the fourth output terminal 44 and the first resistor 11 to the fourth resistor 14 each are 50Ω, and the resistance value of the fifth resistor 15 is 100Ω. Furthermore, the absolute value of the impedance of each of the first capacitor 21 to the fourth capacitor 24 is 50Ω. At this time, impedance matching between the input and the output can be perfectly achieved, and power loss due to reflection can be suppressed. When the fifth resistor 15 is not provided, the impedance matching cannot be perfectly achieved, and the power loss occurs.

As described above, according to the polyphase filter of the first embodiment, the first resistor, the first reactance element, the second resistor, the second reactance element, the third resistor, the third reactance element, the fourth resistor, and the fourth reactance element are connected together in series in the ring shape, and the fifth resistor is connected between the series connection point between the first reactance element and the second resistor and the series connection point between the third reactance element and the fourth resistor, and the first output terminal is connected to the series connection point between the first resistor and the first reactance element, the second output terminal is connected to the series connection point between the second resistor and the second reactance element, the third output terminal is connected to the series connection point between the third resistor and the third reactance element, the fourth output terminal is connected to the series connection point between the fourth resistor and the fourth reactance element, the first input terminal is connected to the series connection point between the fourth reactance element and the first resistor, and the second input terminal is connected to the series connection point between the second reactance element and the third resistor, so that variations in impedance can be suppressed, and the output can be obtained in which the amplitude error and the phase error are suppressed.

Furthermore, according to the polyphase filter of the first embodiment, since the first to fourth reactance elements are capacitors, the polyphase filter can be easily implemented.

Furthermore, according to the polyphase filter of the first embodiment, the absolute value of the fifth resistor is equal to the absolute value of the impedance between the first input terminal and the second input terminal, so that impedance matching between the input and the output is perfectly achieved, the power loss due to the reflection can be suppressed, and the output can be obtained in which the amplitude error and the phase error are suppressed.

Second Embodiment

Figure 2:
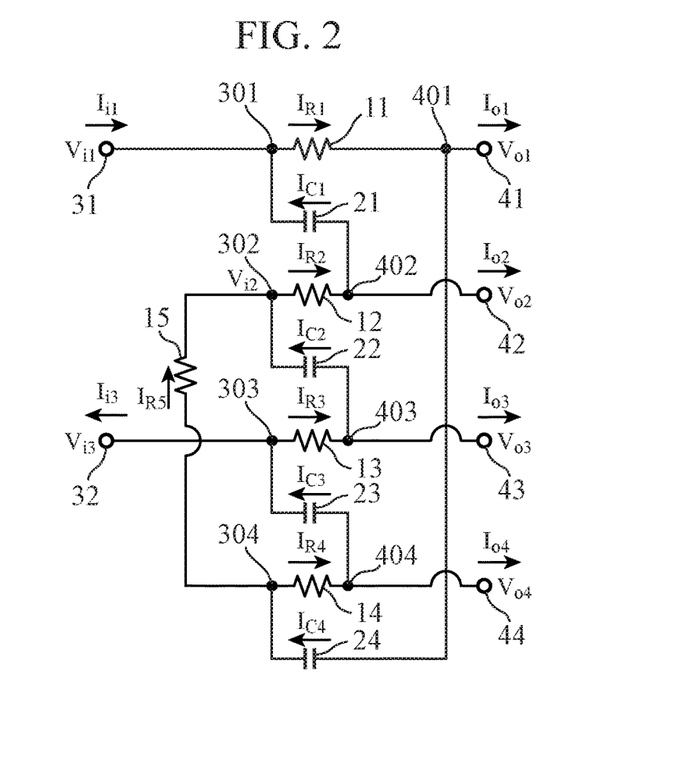
FIG. 2 is a configuration diagram illustrating a polyphase filter according to a second embodiment of the present invention.

FIG. 2 is a configuration diagram illustrating a polyphase filter according to a second embodiment.

In the polyphase filter illustrated in FIG. 2, resistors and capacitors are alternately connected together in series to form a circuit in a ring shape, and input terminals and output terminals are included at connection points between the resistors and the capacitors, similarly to the first embodiment shown in FIG. 1, but the method of connecting the resistors and the capacitors together is different. Specifically, the first input terminal 31 is connected to a series connection point 301 between the first resistor 11 and the first capacitor 21, and the second input terminal 32 is connected to a series connection point 303 between the third resistor 13 and the third capacitor 23. Furthermore, the first output terminal 41 is connected to a series connection point 401 between the first resistor 11 and the fourth capacitor 24, the second output terminal 42 is connected to a series connection point 402 between the second resistor 12 and the first capacitor 21, the third output terminal 43 is connected to a series connection point 403 between the third resistor 13 and the second capacitor 22, and the fourth output terminal 44 is connected to a series connection point 404 between the fourth resistor 14 and the third capacitor 23. Moreover, one end of the fifth resistor 15 is connected to a series connection point 302 between the second capacitor 22 and the second resistor 12, and the other end of the fifth resistor 15 is connected to a series connection point 304 between the fourth capacitor 24 and the fourth resistor 14. The absolute values of the impedances of the first resistor 11 to the fourth resistor 14 and the first capacitor 21 to the fourth capacitor 24 are the same as the impedances of the first input terminal 31 and the second input terminal 32 at a predetermined frequency. However, the ring shape here does not indicate only a circle, but also includes a shape with corners (an arrangement shape including the first resistor 11, the first capacitor 21, the second resistor 12, the second capacitor 22, the third resistor 13, the third capacitor 23, the fourth resistor 14, and the fourth capacitor 24 in FIG. 2).

Next, the operation of the polyphase filter according to the second embodiment will be described.

A radio wave input from the first input terminal 31 is input to the series connection point 301 between the first resistor 11 and the first capacitor 21, and a radio wave input from the second input terminal 32, having a differential relationship with the radio wave input from the first input terminal 31, is input to the series connection point 303 between the third resistor 13 and the third capacitor 23. The first output terminal 41 is connected to the second output terminal 42 through the first capacitor 21, the second output terminal 42 is connected to the third output terminal 43 through the second capacitor 22, the third output terminal 43 is connected to the fourth output terminal 44 through the third capacitor 23, and the fourth output terminal 44 is connected to the first output terminal 41 through the fourth capacitor 24. For this reason, the outputs of the output terminals 41, 42, 43, and 44 differ in phase by 90 degrees each. The resistor between the capacitor and the output terminal does not contribute to the amount of phase shift. Thus, quadrature differential outputs (for example, 0°, −90°, −180°, −270°) can be obtained.

Regarding the amplitude, the current flowing through the first capacitor 21 is merged with the current flowing through the first input terminal 31 and flows through the first resistor 11, and the current flowing through the first resistor 11 is distributed to the first output terminal 41 and the fourth capacitor 24. The current flowing through the second capacitor 22 is merged with the current flowing through the fifth resistor 15 and flows through the second resistor 12, and the current flowing through the second resistor 12 is distributed to the second output terminal 42 and the first capacitor 21. When the fifth resistor 15 is not provided, the current flowing through the second resistor 12 includes only the current flowing through the second capacitor 22, and is not a current balanced with the current flowing through the first resistor 11.

Furthermore, the current flowing through the third capacitor 23 is distributed to the current flowing through the second input terminal 32 (in a reverse-phase relationship with the first input terminal 31) and the third resistor 13, and the current flowing through the third resistor 13 is distributed to the third output terminal 43 and the second capacitor 22. The current flowing through the fourth capacitor 24 is distributed to the fifth resistor 15 and the fourth resistor 14, and the current flowing through the fourth resistor 14 is distributed to the fourth output terminal 44 and the third capacitor 23. When the fifth resistor 15 is not provided, the current flowing through the fourth resistor 14 includes only the current flowing through the fourth capacitor 24, and is not a current balanced with the current flowing through the third resistor 13.

From these, by providing the fifth resistor 15, a highly symmetrical voltage-current relationship is formed. Since the impedance is the ratio between the voltage and the current, a good balance between the voltage and the current makes the impedances equal to each other, and can eliminate a deviation of the impedance matching. Furthermore, since the voltage and the current are balanced with each other, the amplitude error and the phase error are suppressed. Furthermore, since the amplitude error is a factor of the phase error when the vector composition is considered, suppressing the amplitude error also suppresses the phase error.

Furthermore, resistance values of the first resistor 11 to the fourth resistor 14 are made equal to impedances of the first input terminal 31, the second input terminal 32, and the first output terminal 41 to the fourth output terminal 44, and a resistance value of the fifth resistor 15 is set to be twice the impedance of the first input terminal 31 (equal to a load impedance between the first input terminal 31 and the second input terminal 32), whereby, in principle, impedance matching can be achieved at all input and output terminals, and the amplitude error and the phase error can be made zero. For example, when load impedances of the first input terminal 31 and the second input terminal 32 each are 50Ω, the impedance between the first input terminal 31 and the second input terminal 32 is 100Ω, the resistance values of the first output terminal 41 to the fourth output terminal 44 and the first resistor 11 to the fourth resistor 14 each are 50Ω, and the resistance value of the fifth resistor 15 is 100Ω. Furthermore, the absolute value of the impedance of each of the first capacitor 21 to the fourth capacitor 24 is 50Ω. At this time, impedance matching between the input and the output can be perfectly achieved, and power loss due to reflection can be suppressed. When the fifth resistor 15 is not provided, the impedance matching cannot be perfectly achieved, and the power loss occurs.

As described above, according to the polyphase filter of the second embodiment, the first resistor, the first reactance element, the second resistor, the second reactance element, the third resistor, the third reactance element, the fourth resistor, and the fourth reactance element are connected together in series in the ring shape, and the fifth resistor is connected between the series connection point between the second resistor and the second reactance element and the series connection point between the fourth resistor and the fourth reactance element, and the first output terminal is connected to the series connection point between the fourth reactance element and the first resistor, the second output terminal is connected to the series connection point between the first reactance element and the second resistor, the third output terminal is connected to the series connection point between the second reactance element and the third resistor, the fourth output terminal is connected to the series connection point between the third reactance element and the fourth resistor, the first input terminal is connected to the series connection point between the first resistor and the first reactance element, and the second input terminal is connected to the series connection point between the third resistor and the third reactance element, so that variations in impedance can be suppressed, and the output can be obtained in which the amplitude error and the phase error are suppressed.

Third Embodiment

Figure 3:
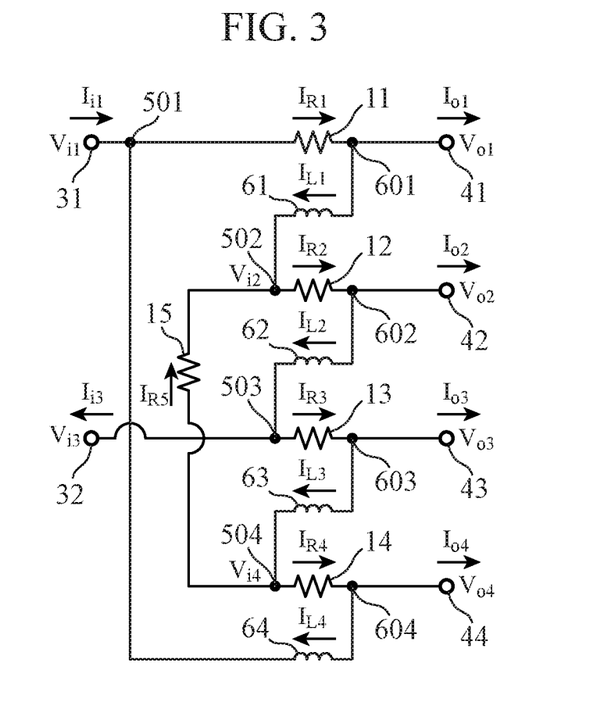
FIG. 3 is a configuration diagram illustrating a polyphase filter according to a third embodiment of the present invention.

A third embodiment is an example in which the first capacitor 21 to the fourth capacitor 24 in the first embodiment are replaced with inductors. FIG. 3 illustrates a configuration of a polyphase filter according to the third embodiment.

As illustrated in FIG. 3, in the polyphase filter according to the third embodiment, the first capacitor 21 of the first embodiment is replaced with a first inductor 61, the second capacitor 22 is replaced with a second inductor 62, the third capacitor 23 is replaced with a third inductor 63, and the fourth capacitor 24 is replaced with a fourth inductor 64. Furthermore, the series connection point 101 in the first embodiment corresponds to a series connection point 501, the series connection point 102 corresponds to a series connection point 502, the series connection point 103 corresponds to a series connection point 503, and the series connection point 104 corresponds to a series connection point 504. Moreover, the series connection point 201 in the first embodiment corresponds to a series connection point 601, the series connection point 202 corresponds to a series connection point 602, the series connection point 203 corresponds to a series connection point 603, and the series connection point 204 corresponds to a series connection point 604. In the figure, $I_{L1}$ to $I_{L4}$ represent currents flowing through the first inductor 61 to the fourth inductor 64, respectively.

Next, the operation of the polyphase filter according to the third embodiment will be described.

The basic operation is similar to that of the polyphase filter according to the first embodiment. The difference from the first embodiment is that the phases of the capacitor and the inductor are opposite to each other, and a phase relationship among output waves from the first output terminal 41 to the fourth output terminal 44 is, for example, 0°, 90°, 180°, 270°. From these, by providing the fifth resistor 15, a highly symmetrical voltage-current relationship is formed, the variations in impedance can be suppressed, and the amplitude error and the phase error are suppressed.

Furthermore, resistance values of the first resistor 11 to the fourth resistor 14 are made equal to those of the first input terminal 31, the second input terminal 32, and the first output terminal 41 to the fourth output terminal 44, and a resistance value of the fifth resistor 15 is set to be twice the impedance of the first input terminal 31 (equal to a load impedance between the first input terminal 31 and the second input terminal 32), whereby, in principle, impedance matching can be achieved at all input and output terminals, and the amplitude error and the phase error can be made zero.

Furthermore, the first inductor 61 to the fourth inductors 64 may be replaced with transmission lines having a length of ¼ wavelength at a predetermined frequency. By making the characteristic impedances of the transmission lines equal to the impedance of the first input terminal 31, a highly symmetrical voltage-current relationship is formed.

As described above, according to the polyphase filter of the third embodiment, since the first to fourth reactance elements are inductors, the polyphase filter can be easily implemented.

Furthermore, according to the polyphase filter of the third embodiment, since the first to fourth reactance elements are transmission lines, the polyphase filter can be easily implemented.

Fourth Embodiment

Figure 4:
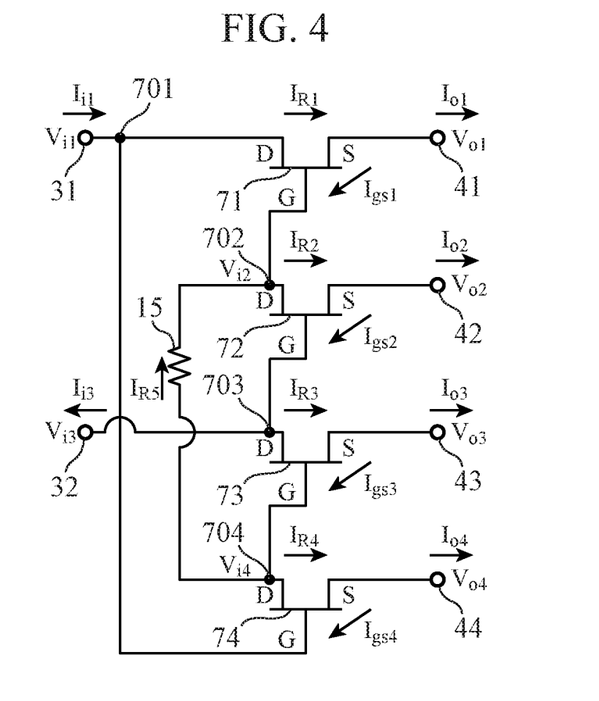
FIG. 4 is a configuration diagram illustrating a polyphase filter according to a fourth embodiment of the present invention.

A fourth embodiment is an example in which the first resistor 11 to the fourth resistor 14 and the first capacitor 21 to the fourth capacitor 24 in the first embodiment are replaced with drain-source resistances and gate-source capacitances of transistors. FIG. 4 illustrates a configuration of a polyphase filter according to the fourth embodiment.

As illustrated in FIG. 4, the polyphase filter according to the fourth embodiment includes a first transistor 71 to a fourth transistor 74. The first input terminal 31 is connected to a connection point 701 between the drain terminal of the first transistor 71 and the gate terminal of the fourth transistor 74, and the second input terminal 32 is connected to a connection point 703 between the drain terminal of the third transistor 73 and the gate terminal of the second transistor 72. Furthermore, the first output terminal 41 is connected to the source terminal of the first transistor 71, the second output terminal 42 is connected to the source terminal of the second transistor 72, the third output terminal 43 is connected to the source terminal of the third transistor 73, and the fourth output terminal 44 is connected to the source terminal of the fourth transistor 74. Furthermore, the gate terminal of the first transistor 71 and the drain terminal of the second transistor 72 are connected together at a connection point 702, and the gate terminal of the third transistor 73 and the drain terminal of the fourth transistor 74 are connected together at a connection point 704. Then, the fifth resistor 15 is connected between the connection point 702 and the connection point 704.

Figure 5:
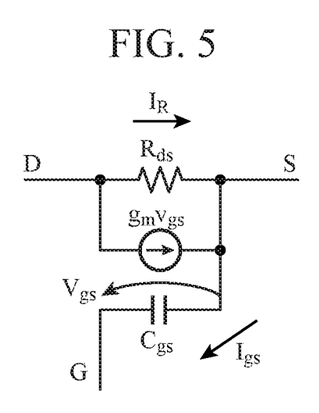
FIG. 5 is an equivalent circuit diagram of a transistor of the polyphase filter according to the fourth embodiment of the present invention.

FIG. 5 is a basic equivalent circuit of the transistor. The transistor has a resistance Rds and a mutual conductance gm between the drain and the source, and a capacitance Cgs between the gate and the source. Here, when there is no bias voltage to the transistor, a current source representing the mutual conductance has a very large impedance and can be ignored. Thus, FIG. 4 is equivalent to FIG. 1.

Next, the operation of the polyphase filter according to the fourth embodiment will be described.

Since the circuit configuration is equivalent to that of FIG. 1, the operation similar to the first embodiment is performed.

A radio wave input from the first input terminal 31 is input to the connection point 701 between the drain terminal of the first transistor 71 and the gate terminal of the fourth transistor 74, and a radio wave input from the second input terminal 32, having a differential relationship with the radio wave input from the first input terminal 31, is input to the connection point 703 between the drain terminal of the third transistor 73 and the gate terminal of the second transistor 72. The first output terminal 41 is connected to the second output terminal 42 through a gate-source capacitance of the first transistor 71, the second output terminal 42 is connected to the third output terminal 43 through a gate-source capacitance of the second transistor 72, the third output terminal 43 is connected to the fourth output terminal 44 through a gate-source capacitance of the third transistor 73, and the fourth output terminal 44 is connected to the first output terminal 41 through a gate-source capacitance of the fourth transistor 74. For this reason, the outputs of the output terminals 41, 42, 43, and 44 differ in phase by 90 degrees each. The drain-source resistance of each of the transistors 71 to 74 does not contribute to the amount of phase shift. Thus, quadrature differential outputs (for example, 0°, −90°, −180°, −270°) can be obtained.

Regarding the amplitude, a current flowing through the gate-source capacitance of the fourth transistor 74 is merged with the current flowing through the first input terminal 31 and flows through the drain-source resistance of the first transistor 71, and the current flowing through the drain-source resistance of the first transistor 71 is distributed to the first output terminal 41 and the gate-source capacitance of the first transistor 71. A current flowing through the gate-source capacitance of the first transistor 71 is merged with the current flowing through the fifth resistor 15 and flows through the drain-source resistance of the second transistor 72, and the current flowing through the drain-source resistance of the second transistor 72 is distributed to the second output terminal 42 and the gate-source capacitance of the second transistor 72. When the fifth resistor 15 is not provided, the current flowing through the drain-source resistance of the second transistor 72 includes only the current flowing through the gate-source capacitance of the first transistor 71, and is not a current balanced with the current flowing through the drain-source resistance of the first transistor 71.

Furthermore, a current flowing through the gate-source capacitance of the second transistor 72 is distributed to the current flowing through the second input terminal 32 (in a reverse-phase relationship with the first input terminal 31) and the drain-source resistance of the third transistor 73, and a current flowing through the drain-source resistance of the third transistor 73 is distributed to the third output terminal 43 and the gate-source capacitance of the third transistor 73. A current flowing through the gate-source capacitance of the third transistor 73 is distributed to the fifth resistor 15 and the drain-source resistance of the fourth transistor 74, and the current flowing through the drain-source resistance of the fourth transistor 74 is distributed to the fourth output terminal 44 and the gate-source capacitance of the fourth transistor 74. When the fifth resistor 15 is not provided, the current flowing through the drain-source resistance of the fourth transistor 74 is equal to the current flowing through the gate-source capacitance of the third transistor 73, and is not a current balanced with the current flowing through the drain-source resistance of the third transistor 73.

From these, by providing the fifth resistor 15, a highly symmetrical voltage-current relationship is formed, the variations in impedance can be suppressed, and the amplitude error and the phase error are suppressed.

Furthermore, values of the drain-source resistances of the first transistor 71 to the fourth transistor 74 are made equal to the impedance between the first input terminal 31 and the second input terminal 32 and the impedances of the first output terminal 41 to the fourth output terminal 44, and a resistance value of the fifth resistor 15 is set to be twice the impedance of the first input terminal 31 (equal to a load impedance between the first input terminal 31 and the second input terminal 32), whereby, in principle, impedance matching can be achieved at all input and output terminals, and the amplitude error and the phase error can be made zero.

Furthermore, a resistor may be loaded in parallel with the drain-source resistance of the transistor, and a capacitor may be loaded in parallel with the gate-source capacitance of the transistor.

Furthermore, since the amplification action of the transistor is not used in the fourth embodiment, it is not necessary to apply a DC voltage to the transistor. However, a DC voltage may be applied to the transistor to control the mutual conductance, the gate-source capacitance, and the like.

As described above, according to the polyphase filter of the fourth embodiment, the first to fourth resistors are the drain-source resistances of the transistors, and the first to fourth reactance elements are the gate-source capacitances of the transistors, so that variations in impedance can be suppressed, and the output can be obtained in which the amplitude error and the phase error are suppressed.

Note that, in the invention of the present application, within the scope of the invention, free combination of embodiments, a modification of an arbitrary component of each embodiment, or omission of an arbitrary component in each embodiment is possible.

INDUSTRIAL APPLICABILITY

As described above, the polyphase filter according to the present invention relates to the configuration of the RC polyphase filter and is suitable for use in a high frequency circuit.

REFERENCE SIGNS LIST

11: first resistor,
12: second resistor,
13: third resistor,
14: fourth resistor,
21: first capacitor,
22: second capacitor,
23: third capacitor,
24: fourth capacitor,
31: first input terminal,
32: second input terminal,
41: first output terminal,
42: second output terminal,
43: third output terminal,
44: fourth output terminal,
71: first transistor,
72: second transistor,
73: third transistor,
74: fourth transistor, and
101-104, 201-204, 301-304, 401-404, 501-504, 601-604, and 701-704: series connection point.

What is claimed is:

1. A polyphase filter, comprising a first input terminal, a second input terminal, a first output terminal, a second output terminal, a third output terminal, a fourth output terminal,
   a first resistor, a first reactance element, a second resistor, a second reactance element, a third resistor, a third reactance element, a fourth resistor, a fourth reactance element, and a fifth resistor, wherein,
   the first resistor, the first reactance element, the second resistor, the second reactance element, the third resistor, the third reactance element, the fourth resistor, and the fourth reactance element are connected together in series in a ring shape,
   the fifth resistor is connected between a series connection point between the first reactance element and the second resistor and a series connection point between the third reactance element and the fourth resistor,
   the first output terminal is connected to a series connection point between the first resistor and the first reactance element,
   the second output terminal is connected to a series connection point between the second resistor and the second reactance element,
   the third output terminal is connected to a series connection point between the third resistor and the third reactance element,
   the fourth output terminal is connected to a series connection point between the fourth resistor and the fourth reactance element,
   the first input terminal is connected to a series connection point between the fourth reactance element and the first resistor, and
   the second input terminal is connected to a series connection point between the second reactance element and the third resistor.

2. A polyphase filter, comprising a first input terminal, a second input terminal, a first output terminal, a second out terminal, a third output terminal, a fourth output terminal,
   a first resistor, a first reactance element, a second resistor, a second reactance element, a third resistor, a third reactance element, a fourth resistor, a fourth reactance element, and a fifth resistor, wherein,
   the first resistor, the first reactance element, the second resistor, the second reactance element, the third resistor, the third reactance element, the fourth resistor, and the fourth reactance element are connected together in series in a ring shape,
   the fifth resistor is connected between a series connection point between the second resistor and the second reactance element and a series connection point between the fourth resistor and the fourth reactance element,
   the first output terminal is connected to a series connection point between the fourth reactance element and the first resistor,
   the second output terminal is connected to a series connection point between the first reactance element and the second resistor,
   the third output terminal is connected to a series connection point between the second reactance element and the third resistor,
   the fourth output terminal is connected to a series connection point between the third reactance element and the fourth resistor,
   the first input terminal is connected to a series connection point between the first resistor and the first reactance element, and
   the second input terminal is connected to a series connection point between the third resistor and the third reactance element.

3. The polyphase filter according to claim 1, wherein the first to fourth reactance elements are capacitors.

4. The polyphase filter according to claim 1, wherein the first to fourth reactance elements are inductors.

5. The polyphase filter according to claim 1, wherein the first to fourth reactance elements are transmission lines.

6. The polyphase filter according to claim 1, wherein the first to fourth resistors are drain-source resistances of transistors, and the first to fourth reactance elements are gate-source capacitances of the transistors.

7. The polyphase filter according to claim 1, wherein an absolute value of the fifth resistor is equal to an absolute value of an impedance between the first input terminal and the second input terminal.

8. The polyphase filter according to claim 2, wherein the first to fourth reactance elements are capacitors.

9. The polyphase filter according to claim 2, wherein the first to fourth reactance elements are inductors.

10. The polyphase filter according to claim 2, wherein the first to fourth reactance elements are transmission lines.

11. The polyphase filter according to claim 2, wherein the first to fourth resistors are drain-source resistances of transistors, and the first to fourth reactance elements are gate-source capacitances of the transistors.

12. The polyphase filter according to claim 2, wherein an absolute value of the fifth resistor is equal to an absolute value of an impedance between the first input terminal and the second input terminal.

* * * * *